(12) United States Patent
Grover

(10) Patent No.: US 6,747,880 B2
(45) Date of Patent: Jun. 8, 2004

(54) SELF-POWERED SYNCHRONOUS RECTIFIERS

(75) Inventor: Raymond J. Grover, Didsbury (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 136 days.

(21) Appl. No.: 10/101,990

(22) Filed: Mar. 20, 2002

(65) Prior Publication Data

US 2002/0141214 A1 Oct. 3, 2002

(30) Foreign Application Priority Data

Mar. 28, 2001 (GB) .............................. 0107662
Apr. 4, 2001 (GB) .............................. 0108382

(51) Int. Cl.$^7$ .............................................. H02M 3/335
(52) U.S. Cl. .................... 363/21.06; 363/21.14
(58) Field of Search ................. 363/125, 127, 363/21.06, 21.14

(56) References Cited

U.S. PATENT DOCUMENTS

| | | | | |
|---|---|---|---|---|
| 5,535,112 A | * | 7/1996 | Vazquez Lopez et al. | .... 363/20 |
| 5,616,945 A | * | 4/1997 | Williams | ..................... 257/365 |
| 5,973,367 A | * | 10/1999 | Williams | ..................... 257/365 |
| 5,991,182 A | | 11/1999 | Novac et al. | ............... 363/126 |
| 6,060,943 A | | 5/2000 | Jansen | ......................... 327/538 |
| 6,421,262 B1 | * | 7/2002 | Saxelby et al. | ............. 363/127 |

OTHER PUBLICATIONS

Philips Semiconductors, "Power Semiconductors Applications Handbook" 1995, pp. 179–183.

* cited by examiner

*Primary Examiner*—Adolf Berhane
(74) *Attorney, Agent, or Firm*—Aaron Waxler

(57) ABSTRACT

A two-terminal self-powered synchronous rectifier (ASR) is provided, together with two-terminal or three-terminal packaged devices that can replace an output diode rectifier (D) in a switched mode power supply. The synchronous rectifier comprises a field-effect transistor (M) having its source-drain path in a first arm (11) between the two rectifier terminals (A,K), normally a parallel diode (BD) in a second arm (12), a gate-control circuit (GC) connected to a gate electrode (g) of the transistor (M) for switching the transistor (M) synchronously on and off in accordance with voltage reversal at the two rectifier terminals (A,K), and a charge pump (C,R; C,R,C2,R2) in a third parallel arm for powering the control circuit from the power signal being rectified by the rectifier.

11 Claims, 3 Drawing Sheets

SELF-POWERED SYNCHRONOUS RECTIFIERS

This invention relates to synchronous rectifiers comprising a field-effect transistor that is switched synchronously with voltage reversal at the two rectifier terminals. The invention also relates to packaged semiconductor devices for such synchronous rectifiers, and to switched mode power supplies (often termed "SMPS") comprising such synchronous rectifiers and/or such devices.

It is known to replace the output diode rectifier (typically a Schottky diode or pn diode) of a SMPS with a low on-resistance field-effect transistor (typically a MOSFET) that is switched in time with the reversal of its terminal voltage. Such a switched-transistor rectifier circuit is known as a synchronous rectifier. Its lower on-resistance reduces the power losses that occurred with the forward voltage drop of a diode rectifier.

Thus, known synchronous rectifiers comprise a field-effect transistor having its source-drain path between the two rectifier terminals, and a gate-control circuit connected to a gate electrode of the transistor for switching the transistor synchronously on and off in accordance with voltage reversal at the two rectifier terminals.

Examples of synchronous rectifiers and their use are disclosed in Section 2.3.3 "An Introduction to Synchronous Rectifier Circuits using PowerMOS (Trademark) Transistors", pages 179 to 183 of the Power Semiconductors Applications Handbook 1995 of Philips Semiconductors, published December 1994 (1133011/12000/02/; document order no. 9398 652 85011), and, for example, U.S. Pat. Nos. 6,060,943 and 5,991,182. The whole contents of these three items are hereby incorporated herein as reference material.

As described in these three reference items, the field-effect transistor structure commonly includes a parallel p-n diode that is intrinsically formed by a body-drain p-n junction of the transistor and that is connected between the source and drain of the transistor. This p-n diode is variously known as the "parasitic body diode", the "intrinsic diode", the "internal diode", and different combinations of these terms. When the transistor is used as a synchronous rectifier, current flow along the source-drain path is opposite to that for normal transistor use, and so the body diode is reverse-biased when the transistor is blocking. The body diode can perform the rectification (but at a much reduced efficiency) if the gate drive of the transistor is lost and/or in the initial start-up state before the transistor is turned on.

Known synchronous rectifiers are not simple replacements for diode rectifiers, because of the need to provide (in addition to the two rectifier terminals) one or more extra terminals for powering the gate-control circuit. The provision of its own power supply rail for this control circuit can be difficult and/or expensive, especially in a SMPS whose output stage is electrically isolated from the input stage. Simple isolated circuits are known using auxiliary transformer windings for driving the transistor, but these also are expensive to implement and poorly controlled so risking excessive voltage on the gate and consequent damage. As a result, the most extensive use of synchronous rectification at the present time is for high-current low-voltage dc—dc conversion circuits where no isolation is required.

It is an aim of the present invention to provide a synchronous rectifier that does not require extra terminals and/or expensive provisions for its powering aspect, and particularly but not exclusively to provide a two-terminal or three-terminal packaged device that can be a simple replacement for two-terminal diode rectifiers.

According to one aspect of the present invention, there is provided a two-terminal self-powered synchronous rectifier circuit wherein the control power for switching the transistor is drawn from the power signal being rectified by the rectifier. Such a synchronous rectifier in accordance with the invention is advantageously formed with a charge pump that is energised by a voltage difference between the two rectifier terminals, the control circuit being powered from the charge pump.

Advantageously a parallel diode is present between the two rectifier terminals to provide rectification during the initial start-up state, until the charge pump is sufficiently energised to power the control circuit for switching the transistor. This diode may simply be the p-n diode intrinsically formed by a body-drain p-n junction of the transistor, but charge-storage effects may then occur if the switching of the transistor is not precisely synchronised, e.g. due to turn-on delay. These charge-storage effects can be avoided by forming the parallel diode as a Schottky diode connected across the body-drain p-n junction of the transistor.

According to another aspect of the invention, there is provided a two-terminal self-powered synchronous rectifier device comprising a two-terminal device package within which the transistor, possible parallel diode, gate-control circuit and its self-generating power supply are accommodated. The self-generating power supply, the parallel diode and the source-drain path of the transistor can be connected between the two terminals of the device package in a parallel configuration.

According to a further aspect of the invention, there is provided a three-terminal synchronous rectifier device comprising a three-terminal device package within which the transistor, possible parallel diode, gate-control circuit and its self-generating power-supply connections are accommodated, the third terminal serving for connection of an external capacitor between the third terminal and one of the two rectifier terminals to complete a charge pump for powering the gate control circuit from the power signal being rectified by the rectifier.

Advantageous technical features of the present invention, and other aspects thereof, are set out in the appended claims.

These and other features of the invention are disclosed in specific embodiments of the present invention, by way of example, that are now to be described with reference to the accompanying drawings. In these drawings.

Figure 2:
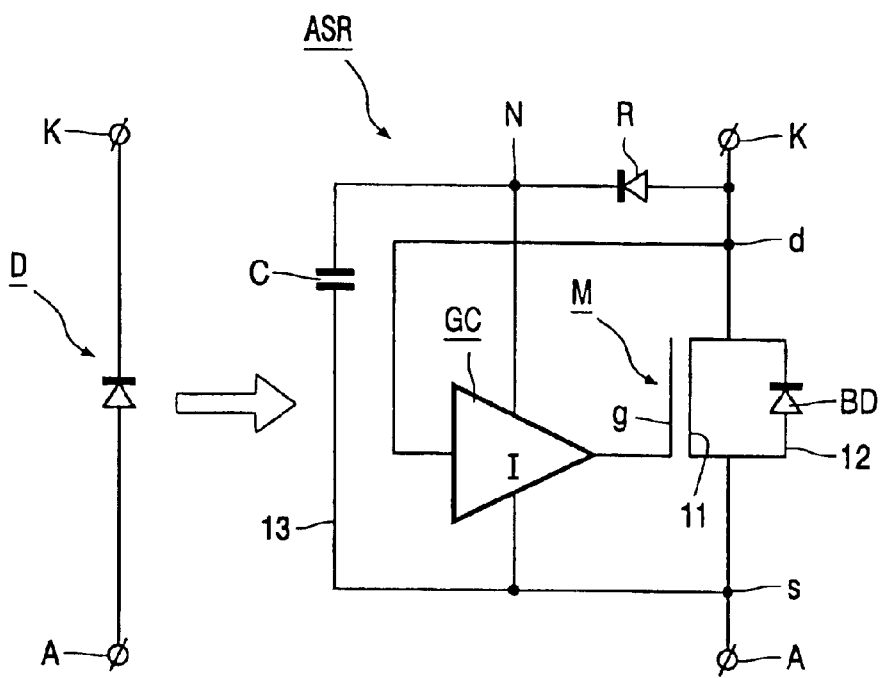
FIG. 2 is a circuit diagram of one embodiment of such a two-terminal self-powered synchronous rectifier in accordance with the invention.
Figure 5:
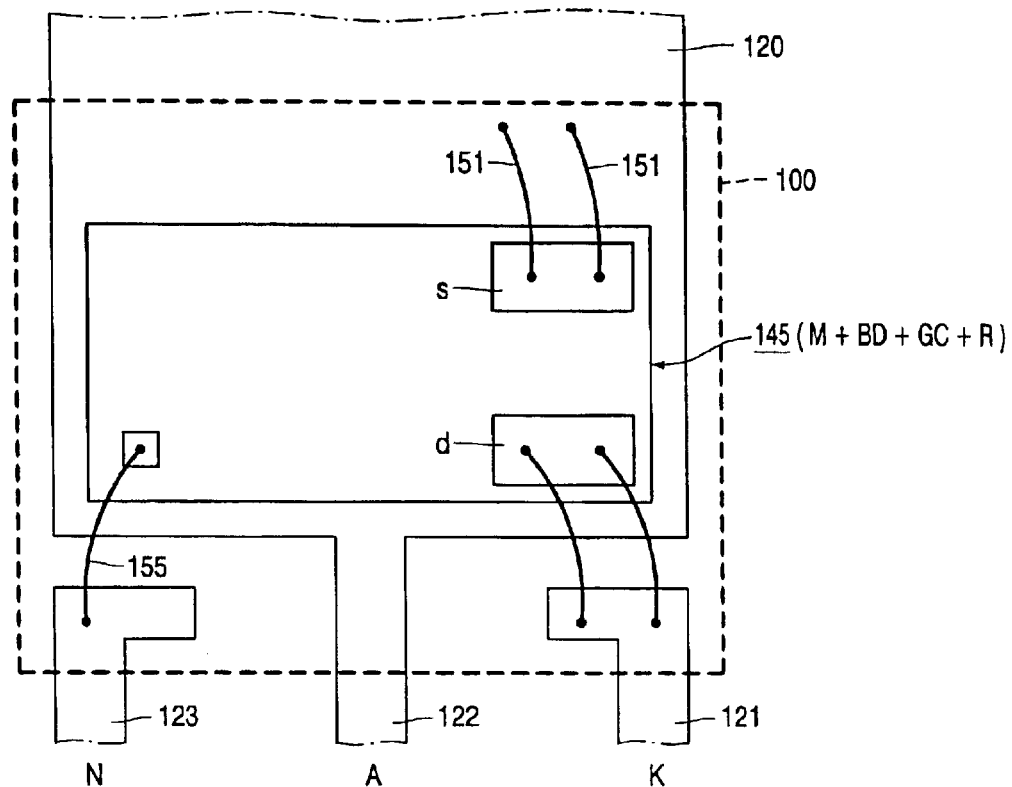
Figure 6:
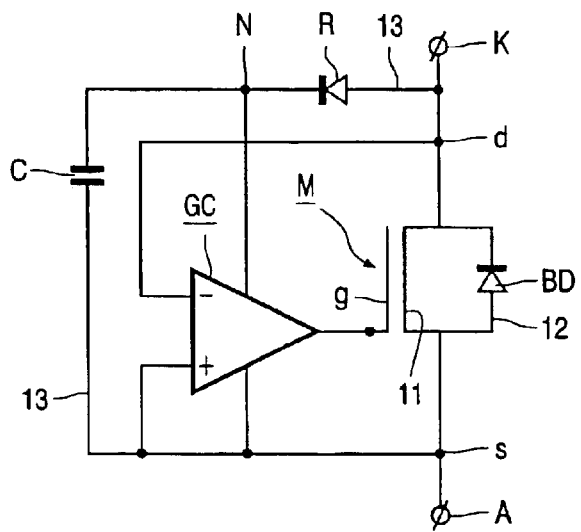

FIG. 5 is a schematic representation of a three-terminal packaged device in accordance with the invention, for forming (together with a capacitor) a two-terminal self-powered synchronous rectifier in accordance with the invention; and FIG. 6 is a circuit diagram of another embodiment of a two-terminal self-powered synchronous rectifier in accordance with the invention, as a modification of the rectifier of FIG. 2.

The same reference signs are generally used to refer to corresponding or similar features in modified and different embodiments.

Figure 4:
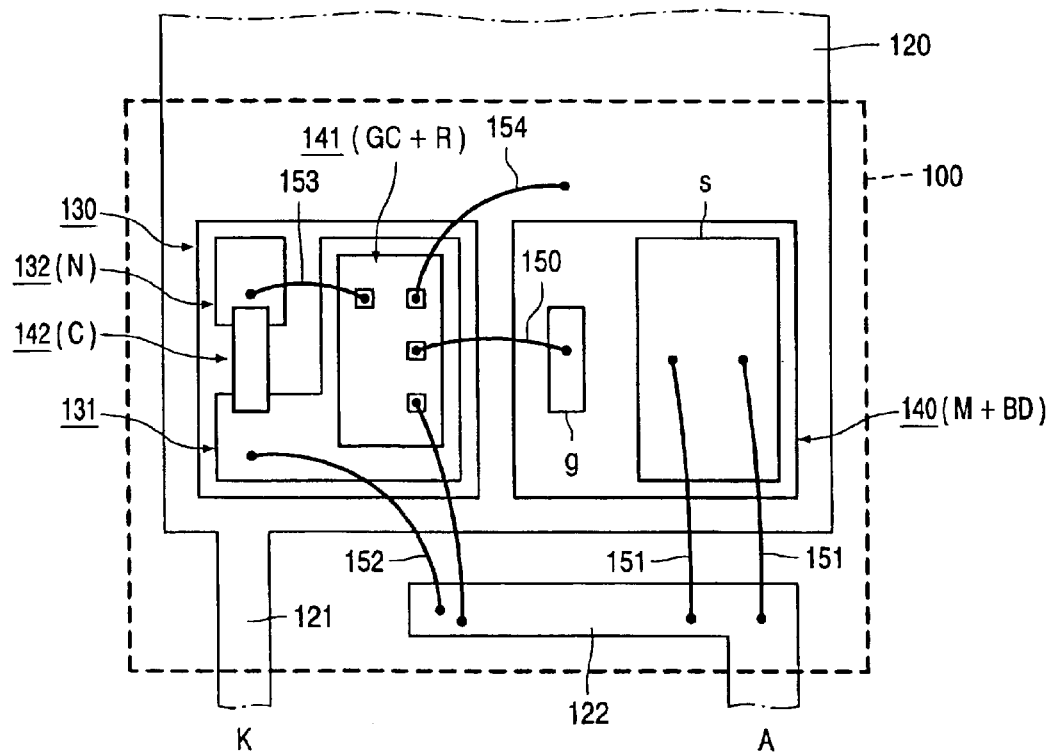
FIG. 4 is a schematic representation of such a self-powered synchronous rectifier in accordance with the invention, embodied in a two-terminal packaged device.

The two-terminal synchronous rectifier embodiments of FIGS. 2, 4 and 6 are self-powered, i.e. autonomous synchronous rectifiers, herein designated ASRs. Each comprises:

- a field-effect transistor M having its source-drain path in a first arm 11 between the two terminals K & A of the rectifier,
- a gate-control circuit GC connected to a gate electrode g of the transistor M for switching the transistor M synchronously on and off in accordance with voltage reversal at the two rectifier terminals K & A, and
- a further parallel arm 13 comprising a charge pump C,R that is energised by a voltage difference between the two rectifier terminals K & A, the gate-control circuit GC being powered from the charge pump C,R.

The transistor M is typically an n-channel cellular MOSFET. Such a MOSFET M is assumed in the circuit diagrams of FIGS. 2 and 3. Its drain electrode d is connected to terminal K of the rectifier, and its source electrode s is connected to terminal A. Typically, a pn diode is intrinsically present in the transistor M, being formed by the body-drain p-n junction of the transistor. The source electrode s contacts the p-type body region of MOSFET M, as well as its n-type source region. Thus, this intrinsic body diode BD is connected parallel to the source-drain path of the transistor M in a second arm 12 between the two rectifier terminals K & A, as illustrated in FIG. 2.

In the simple form illustrated in FIGS. 2 and 6, the charge pump C,R comprises a capacitor C and a series rectifier R that are connected between the two rectifier terminals K & A. The power output for the gate-control circuit GC is taken from the series node N of the capacitor C and series rectifier R. FIG. 2 illustrates a particularly simple form for the gate-control circuit GC, namely an inverter I taking its input from the drain electrode d (i.e. rectifier terminal K).

Thus, the ASR configurations in accordance with the invention combine with the transistor M an autonomous powering arrangement (C,R, for example) that generates an internal power supply to power the control circuit GC. These self-powered rectifier circuits of two-terminal configuration can replace a p-n junction diode D or Schottky diode D in the output stage of a power supply, a specific example of which is represented in FIG. 1.

Figure 1:
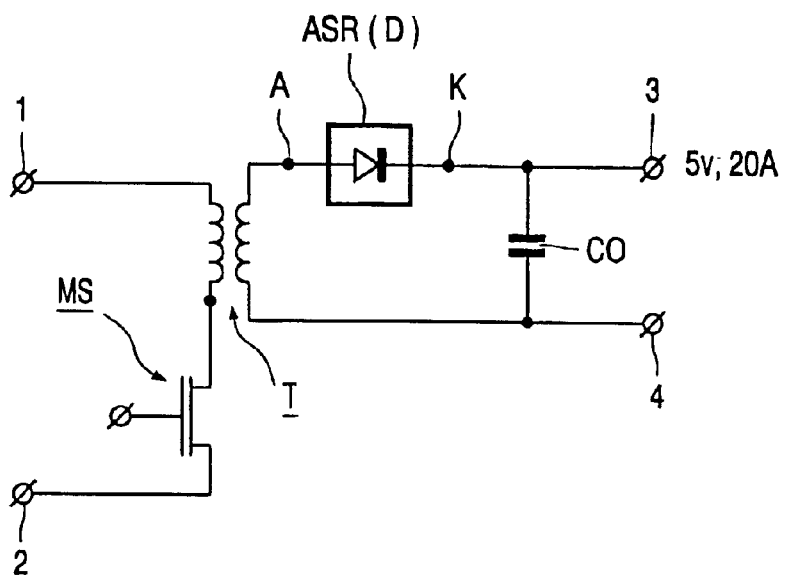
FIG. 1 is a simple circuit diagram of an embodiment of a switched mode power supply comprising a two-terminal self-powered synchronous rectifier in accordance with the invention as a replacement for a diode rectifier.

The specific example of FIG. 1 is a very simple SMPS of the flyback converter type, having input terminals 1 & 2 and output terminals 3 & 4. Its output stage is isolated by a transformer T from its input stage. The input stage is of known configuration, comprising a fast-switching transistor MS that switches the input supply at a high frequency across the primary winding of the transformer T. Hence, a voltage pulse train appears on the secondary winding of the transformer T in the output stage.

This voltage pulse train is appropriately rectified by an output rectifier and smoothed by an output filter to provide the desired dc output for a load (not shown) that is connected across the output terminals 3 & 4. FIG. 1 simply shows a capacitor CO as the output filter. In the SMPS in accordance with the invention the output rectifier is an ASR, instead of a diode D.

In many such power supplies, it is known to perform the final rectification of the current by a p-n junction diode D or a Schottky diode D. A Schottky diode is preferred for low voltage outputs as it has a lower forward voltage drop than a p-n junction, and an absence of stored charge. Even so, the forward voltage drop across a Schottky diode D does result in power losses, reducing the efficiency of the power conversion process.

If (as illustrated in the FIG. 1 example) the output current at terminal 3 is 20A at 5 volts and the supply is switching with a duty cycle of 50%, then 40A will be flowing through the rectifier. If the output rectifier is a Schottky diode D with a forward voltage drop of 0.5 v, then at this current level and at the operating temperature of the device the losses will be about 10 watts. As the supply is delivering 100 watts, the use of the Schottky diode rectifier D would represent a loss of efficiency of about 10%.

To reduce the losses in this FIG. 1 power supply, the output rectifier diode D is replaced with an ASR in accordance with the present invention, as illustrated by the large arrow in FIG. 2. The Rds (on) of its MOSFET M can be very low, e.g. 4 milli-ohms, which in the above example reduces the losses to about 3 watts.

The circuit operation of the ASR of FIG. 2 in a SMPS output stage will now be described in detail. In this circuit description, the transistor M is assumed to be an n-channel MOSFET, and its intrinsic p-n junction diode is used to provide the parallel diode BD as the simplest example. The external circuit in which the ASR is connected is completed by the load between output terminals 3 & 4, or at least by a smoothing capacitor CO if the load is inactive. Thus, the secondary winding of the transformer T and the load and/or the capacitor CO form together a complete circuit for each parallel arm 11, 12 & 13 of the ASR between its terminals A & K. The various components of the ASR of FIG. 2 operate as follows.

(a) In the initial condition, when the power supply is first switched on:
   the capacitor C is in a discharged condition; there is no drive to the transistor gate g, and so the MOSFET M is off;
   the parallel diode BD conducts when terminal K is negative, and so the ASR device appears as a normal p-n junction diode (i.e. in this intrinsic p-n junction diode example of BD);
   rectification takes place via this diode BD;
   thus, the power losses are high for this very short start-up period.

(b) in the steady state:
   capacitor C has charged (via the series rectifier R) to the maximum positive drain voltage excursion;
   the power output from capacitor C at the node N supplies power to the inverter circuit I which inverts the voltage at the drain d (terminal K) to provide a control signal for the MOSFET gate g and thereby to perform the synchronous control of the gate;
   thus the inverter I switches the MOSFET on when the drain voltage goes negative,
   when the drain goes positive the MOSFET is turned off by the inverter 1.

Thus, in general terms, during the start-up phase the charge pump is being charged when the ASR is not conducting, i.e. when its anode terminal A is negative with respect to the cathode terminal K. When the voltage reverses in this start up phase, there may not be enough energy in the charge pump to power the gate control circuit, in which case the MOSFET will remain off. However, the ASR can conduct through the intrinsic body diode BD of the MOSFET. After a few cycles the charge pump will have sufficient stored energy to power the gate control circuit, and current will be alternately blocked by the MOSFET (anode A negative) and conducted by the MOSFET (anode A positive).

It should be noted that an ASR in accordance with the invention can still operate without a parallel diode BD, i.e. without the second parallel arm 12. In this case, there will be no rectification for several cycles of the power supply during the start up phase, until the capacitor C has been sufficiently energised to power the gate control circuit GC. Thus, it is much more efficient and advantageous for start-up to include a diode BD in a parallel arm 12. Furthermore, such a parallel diode BD is already present intrinsically as a parasitic p-n junction body diode in most MOSFETs.

If the switching of the MOSFET is timed exactly, then the body diode will not conduct after the initial start up phase. However, in practice, this timing may not be exact, e.g. because of a delay in charging the gate capacitance of the MOSFET. Thus, for example, if a low-cost gate control circuit is used, it may be too small to be able to switch the MOSFET very quickly. In this case, the body diode will conduct for short periods. This will reduce the efficiency, and it may result in undesirable charge storage effects in the MOSFET or associated circuitry. However, in an ASR in accordance with the invention, an improvement is possible that will avoid body diode conduction at all times, including the start-up phase. This improvement consists of adding a Schottky diode in parallel to the body diode. The Schottky diode may be a separate element, but it could with advantage be integrated into the MOSFET.

The Schottky diode (connected across the intrinsic body diode of the MOSFET) now acts as the parallel diode BD of the ASR. This parallel Schottky diode BD would then operate during start-up instead of the body diode of the MOSFET. The use of such a Schottky diode BD avoids the charge storage effects that might otherwise occur if the MOSFET switching cannot be precisely synchronised.

Unlike previously known synchronous rectifiers, the ASR of the present invention can replace a two-terminal rectifier diode D without requiring additional terminals and/or power supply rails for powering the MOSFET control circuit. It can be embodied in a self-powered two-terminal packaged device. Alternatively, a three-terminal device may be used together with at least one external capacitor C between the third terminal of the device and one of the rectifier terminals K & A. The resulting device-capacitor combination is a two-terminal synchronous rectifier circuit.

FIG. 4 illustrates one example of a two-terminal self-powered synchronous rectifier device. It comprises a two-terminal semiconductor device package within which the transistor M, parallel diode BD, gate-control circuit GC and charge pump C,R are accommodated. The device package may be of standard construction and standard outline, for example as used for known rectifier diodes D. Thus, FIG. 4 illustrates a lead frame 120, 121, 122 that extends from a plastics encapsulation 100 (broken outline) to provide a mounting tab 120 for the device and terminal leads 121 and 122 for the rectifier terminals K and A respectively.

The various components M, BD, R and C of the device may be integrated in known manner within the encapsulation 100.

Thus, for example, the semiconductor device body 140 of the MOSFET M may be mounted directly on a pedestal of the tab 120 within the encapsulation 100, thereby forming a direct connection to the drain electrode d at the bottom of the body 140. The terminal lead 121 (rectifier terminal K) may be integral with tab 120, as illustrated in FIG. 4. FIG. 4 illustrates thick bond wire connections 151 between the source electrode s of MOSFET M and the terminal lead 122 (rectifier terminal A).

In this particular example of FIG. 4, the parallel diode BD is integrated in the same semiconductor device body 140 as the MOSFET M. It may simply be the pn diode intrinsically formed by the p-n junction between the n-type drain drift region of the MOSFET M and its p-type channel region (transistor body region).

In this particular example, there is an insulating substrate 130 (for example of alumina) on the pedestal of the tab 120, beside the MOSFET body 140. A pattern of two separate metallised areas 131 and 132 is present on the top surface of the substrate 130.

An IC (integrated circuit) body 141 mounted on the metallised area 131 contains the gate control circuit GC and the series rectifier R, in this specific example. This metallised area 131 provides the ground connection for GC and has a wire connection 152 to the terminal lead 122 (rectifier terminal A). The metallised area 132 provides the series node N of the charge pump C,R and has a wire connection 153 to a bond-pad of the IC body 141 for both the power line of GC and the cathode of R. An output bond-pad of CG has a wire connection 151 to the gate electrode g of the MOSFET M. Another wire connection 154 extends from the pedestal of the tab 120 (rectifier terminal K) to another bond-pad of IC body 141, for the anode of R and an input of CG.

In this particular example, the powering capacitor C is in the form of a chip-capacitor 142 that is connected between the metallised areas 131 and 132.

Thus, by means of these wire connections 151 to 154, the series rectifier & capacitor R & C, the diode BD and the source-drain path of the transistor M are connected in a parallel configuration between the two rectifier terminals A and K.

Although the series rectifier R is only a small device that does not need to carry much current, it could be provided separate from the IC device body 141, for example in a separate diode body having bottom anode metallisation and a top cathode bond-pad. Thus, in a modification of FIG. 4, this separate diode body may be mounted directly on the pedestal of the tab 120 to form its anode connection to the rectifier terminal K and may have a wire connection 155 from its cathode bond-pad to the metallised area 132 (node N).

The capacitor C is inside the device package 100 in the FIG. 4 embodiment. However, an external capacitor C could be used, for example with the device embodiment of FIG. 5. In this case, the user connects an external capacitor C in the SMPS circuit, so as to be connected between the terminal lead 122 (rectifier terminal A) and a third terminal lead 123 of the packaged device. Within the package 100, the third terminal lead 123 is connected by a bond wire connection 155 to the cathode electrode of the series rectifier R. Thus, the series rectifier R is connected between the terminal leads 121 and 123, and the third terminal lead 123 provides the series node N to power the gate-control circuit GC from the external capacitor C.

FIG. 5 illustrates a specific embodiment of such a three-terminal device, also illustrating as an example the monolithic integration of the MOSFET M, parallel diode BD, gate control circuit GC and series rectifier R in one IC body 145. A silicon-on-insulator (SOI) technology is particularly convenient and advantageous for avoiding parasitic effects between the components. Thus, the components M+BD, GC & R may be formed in separate silicon islands of a silicon layer on an insulating layer or substrate, the islands being laterally bounded by oxide (LOCOS) isolation walls. In this case, as illustrated in FIG. 5, both the source and drain electrodes s & d of the MOSFET M have bond-pads at the top of the IC body 145, with respective wire connections to the terminal leads 122 and 121.

It will be evident that other modifications and variations may be adopted in rectifier circuits and devices in accordance with the invention. Thus, for example, when a Schottky diode BD is connected across the body-drain p-n junction of the transistor M, this Schottky diode BD could be integrated in the semiconductor body 140 of MOSFET M, or it could be provided in a separate diode body mounted in the same device package 100.

The synchronous rectifier of FIG. 2 has three parallel arms 11, 12, 13 between the two terminals A and K of the rectifier circuit. The first arm 11 comprises the source-drain path of MOSFET M which is of low on-resistance but only functions after a short start-up period. The second arm 12 comprises a parallel diode BD that may be the pn diode intrinsically formed by the body-drain p-n junction of the MOSFET or an optional extra Schottky diode BD that may be integrated with or otherwise connected across this MOSFET body diode. It is this diode arm 12 that conducts & rectifies in the short start-up period when the power supply is first switched on. The third arm 13 is a series circuit of a rectifier R and a capacitor C that is charged during the start-up period to power an inverter I or other drive circuit GC for switching the MOSFET M synchronously with voltage reversals at the rectifier terminals A and K. The parallel diode BD and the series rectifier R are of opposite polarity with respect to the rectifier terminals K and A, so as to charge the capacitor C during the start-up period.

Figure 3:
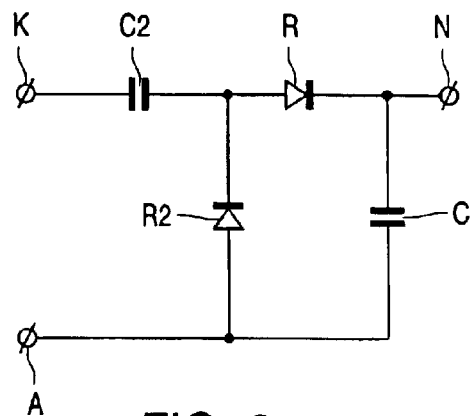
FIG. 3 is a circuit diagram of an alternative charge pump for use in such a two-terminal self-powered synchronous rectifier in accordance with the invention.

The charge pump C,R illustrated in FIG. 2 is a simple series configuration that boosts the power line of the control circuit GC to no more than the maximum voltage between the terminals A & K. Thus, an AC input of + or −V between terminals A & K produces a rectified output of +V at the series node N of R & C. FIG. 3 illustrates a different circuit configuration R2,C2,R,C for the charge pump that permits the output at node N to be higher. Thus, an AC input of + or −V between terminals A & K can produce a rectified output of +2V at the series node N of R & C in FIG. 3. A charge pump like that of FIG. 3 may be used for the ASRs of FIGS. 1, 2, 4, 5 & 6, instead of the simple series configuration R,C, when a higher voltage output is required for the control circuit GC. The additional components R2 & C2 may be included in the device package 100 of FIG. 4 in the same way as the components R & C. Alternatively, both the capacitors C & C2 may be external components with a three-terminal device like that of FIG. 5.

The present invention enables the circuit GC that performs the synchronous control of the MOSFET gate g to be simple. Thus, FIG. 2 illustrates an inverter I that takes its input from the drain electrode d. However, if desired, more sophisticated circuits may be adopted, for example a voltage comparator as illustrated in FIG. 6. This comparator circuit CG compares the voltage at the source electrode s with the voltage at the drain electrode d to generate its output drive to the gate electrode g. When the FIG. 6 rectifier is implemented in a device of the FIG. 4 type, a bond wire 154 may form the connection between the rectifier terminal K and the negative (−) input line of the comparator, and the un-numbered (optional) bond wire in FIG. 4 may form the connection between the rectifier terminal A and the positive (+) input line of the comparator.

From reading the present disclosure, other variations and modifications will be apparent to persons skilled in the art. Such variations and modifications may involve equivalent and other features which are already known in the art and which may be used instead of or in addition to features described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A two-terminal synchronous rectifier comprising a field-effect transistor having its source-drain path in a first arm between the two rectifier terminals, and a gate-control circuit connected to a gate electrode of the transistor for switching the transistor synchronously in accordance with voltage reversal at the two rectifier terminals, wherein the synchronous rectifier includes a further parallel arm comprising a charge pump that is energized by a voltage difference between the two rectifier terminals, the gate-control circuit being powered from the charge pump.

2. A synchronous rectifier according to claim 1 wherein the gate-control circuit is an inverter that is connected between the drain and gate of the transistor.

3. A synchronous rectifier according to claim 1, wherein the charge pump comprises a capacitor and a series rectifier that are connected between the two rectifier terminals, and a power output for the gate-control circuit is taken from the series node of the capacitor and series rectifier.

4. A synchronous rectifier according to claim 1, wherein a parallel diode is connected in another arm between the two rectifier terminals to provide rectification during start-up of the synchronous rectifier.

5. A synchronous rectifier according to claim 4, wherein the parallel diode is a pn diode intrinsically formed by the body-drain p-n junction of the transistor.

6. A synchronous rectifier according to claim 4, wherein the parallel diode is a Schottky diode.

7. A synchronous rectifier according to claim 4, in the form of a self-powered packaged device, which has a two-terminal semiconductor device package within which the transistor, optional parallel diode, gate-control circuit and charge pump are accommodated.

8. A synchronous rectifier according to claim 1, further comprising a circuit connection of a packaged three-terminal semiconductor device and an external capacitor, wherein the two rectifier terminals comprise two of the device terminals, the charge pump comprises the capacitor and a series rectifier that are connected between the two rectifier terminals, and wherein the transistor, optional parallel diode, gate-control circuit and series rectifier are accommodated within the three-terminal package of the device, and the third device terminal provides a series node of the series rectifier and the external capacitor, from which a power output is taken within the package to power the gate-control circuit.

9. A three-terminal synchronous rectifier device for a synchronous rectifier according to claim 8, comprising a three-terminal package within which a field-effect transistor, parallel diode, gate-control circuit and series rectifier are accommodated, wherein an output of the gate-control circuit is connected within the device package to a gate electrode of the transistor for switching the transistor, and wherein the parallel diode and the source-drain path of the transistor are connected between first and second terminals of the device package, and the series rectifier is connected between the first terminal and a third terminal of the device package, which third terminal provides a series node for connecting an external capacitor between the series rectifier and the second terminal for forming a charge-pump power supply that powers the gate-control circuit from the third terminal.

10. A switched mode power supply comprising in an output stage a synchronous rectifier according to claim 1, the output stage being electrically isolated from an input stage by a transformer.

11. A two-terminal self-powered synchronous rectifier device comprising a two-terminal package within which a field-effect transistor, parallel diode, gate-control circuit and charge pump are accommodated, wherein an output of the gate-control circuit is connected within the device package to a gate electrode of the transistor for switching the transistor, and wherein the charge-pump, the parallel diode and the source-drain path of the transistor are connected between the two terminals of the device package in a parallel configuration, and the charge pump has an output that powers the gate-control circuit for switching the transistor.

* * * * *